United States Patent

Nagase et al.

[11] Patent Number: 6,033,787
[45] Date of Patent: Mar. 7, 2000

[54] CERAMIC CIRCUIT BOARD WITH HEAT SINK

[75] Inventors: Toshiyuki Nagase; Yoshirou Kuromitsu; Kunio Sugamura; Yoshio Kanda; Masafumi Hatsushika; Masato Otsuki, all of Omiya, Japan

[73] Assignee: Mitsubishi Materials Corporation, Tokyo, Japan

[21] Appl. No.: 08/916,258

[22] Filed: Aug. 22, 1997

[30] Foreign Application Priority Data

Aug. 22, 1996 [JP] Japan .................................. 8-221477
Mar. 26, 1997 [JP] Japan .................................. 9-072962

[51] Int. Cl.[7] .............................. B22F 3/00; H01L 23/10
[52] U.S. Cl. .......................... 428/545; 428/210; 428/615; 428/627; 257/706; 257/753; 228/121; 228/180.21
[58] Field of Search ........................... 428/210, 615, 428/545, 627; 257/706, 753; 228/180.21, 121

[56] References Cited

U.S. PATENT DOCUMENTS

| | | | |
|---|---|---|---|
| 4,770,953 | 9/1988 | Horiguchi et al. ................. | 428/210 |
| 5,011,732 | 4/1991 | Takeuchi et al. ................. | 428/210 |
| 5,130,498 | 7/1992 | Yoshida et al. ................. | 174/252 |
| 5,145,540 | 9/1992 | Foley et al. ................. | 428/210 |
| 5,213,877 | 5/1993 | Yoshida et al. ................. | 428/210 |
| 5,529,852 | 6/1996 | Sasame et al. ................. | 428/210 |
| 5,616,421 | 4/1997 | Sawtell et al. ................. | 428/614 |
| 5,675,474 | 10/1997 | Nagase et al. ................. | 361/704 |

OTHER PUBLICATIONS

Alcoa's Al–SiC Cermets for Microelectronic Packaging Catalog, Aluminum Company of America Alcoa Center, PA.

*Primary Examiner*—Deborah Jones
*Assistant Examiner*—Cathy F. Lam
*Attorney, Agent, or Firm*—Oblon, Spivak, McClelland, Maier & Neustadt, P.C.

[57] ABSTRACT

A ceramic circuit board with a heat sink which has a long life under heat cycles. First and second aluminum plates are laminated and bonded onto both sides of a ceramic substrate through Al—Si-based brazing solders, respectively. A heat sink formed of an AlSiC-based composite material is laminated and bonded onto a surface of the first aluminum plate. The ceramic substrate is formed of AlN, $Si_3N_4$ or $Al_2O_3$. An Al alloy in the heat sink has an Al purity of 80–99% by weight, and the first or second aluminum plate has an Al purity not less than 99.98% by weight. The heat sink is laminated and bonded onto the first aluminum plate through the Al alloy in the heat sink.

10 Claims, 4 Drawing Sheets

CERAMIC CIRCUIT BOARD WITH HEAT SINK

BACKGROUND OF THE INVENTION

1. Field of the Invention

The present invention relates to a ceramic circuit board for use in semiconductor devices, such as a power module board, for example. More particularly, the present invention relates to a ceramic circuit board having a heat sink to dissipate heat generated from heating elements such as semiconductor chips.

2. Description of the Related Art

Figure 10:
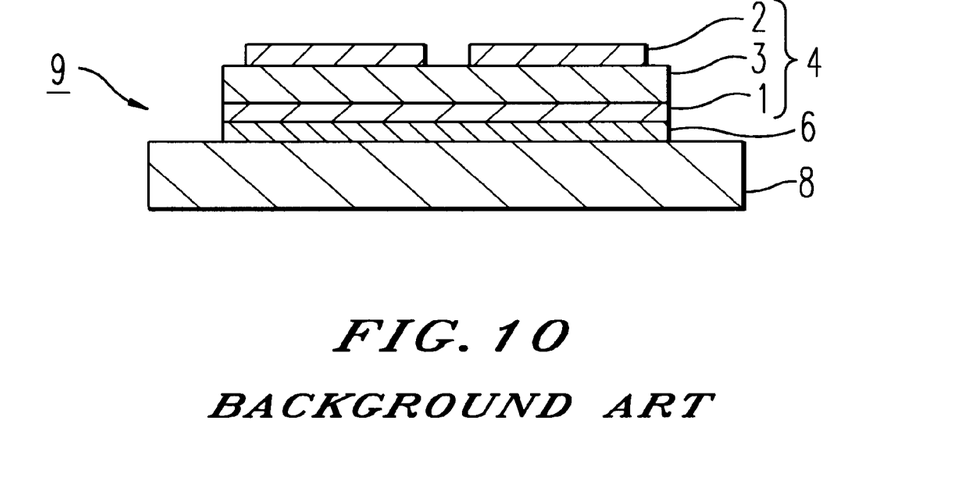
FIG. 10 is a sectional view corresponding to FIG. 1, the view showing a ceramic circuit board with a heat sink according to the background art and Comparative Example 2.

One example of a ceramic circuit board 9 in a semiconductor device is shown in FIG. 10 in which first and second copper plates 1, 2 are laminated and bonded onto both sides of a ceramic substrate 3 formed of AlN, thereby constructing a multilayer structure 4. The structure 4 is bonded by a soft solder (pewter) 6 to an upper surface of a heat sink 8 formed of an AlSiC-based composite material. In this background circuit board 9, the structure 4 is fabricated by bonding the first and second copper plates 1, 2 to the ceramic substrate 3 with a DBC (Direct Bond Copper) process. Specifically, in a condition that the ceramic substrate 3 and the second copper plate 2 are placed successively over the first copper plate 1, the assembly is subjected to a load of 0.5–2 kgf/cm$^2$ and is heated to 1065–1075° C. in a N$_2$ atmosphere. The second copper plate 2 of the structure 4 is then patterned by etching to have a circuit with a predetermined pattern. After that, the heat sink 8 having a Ni plating formed on its upper surface is bonded by the soft solder 6 to the first copper plate 1 of the structure 4, and semiconductor chips, etc. (not shown) are mounted on the second copper plate 2.

In the ceramic circuit board thus constructed, the heat generated from the semiconductor chips, etc. is dissipated from the surfaces of the heat sink 8 through the second copper plate 2, the ceramic substrate 3, the first copper plate 1 and the soft solder 6.

The above background ceramic circuit board has however resulted in a concern that when the substrate temperature is changed between high and low temperatures repeatedly upon activation and deactivation of the semiconductor chips, etc., the ceramic substrate 3 may crack because the first and second copper plates 1, 2 are different in thermal expansion coefficient from the ceramic substrate 3 and have a relatively large resistance against deformation.

Another disadvantage of the above background ceramic circuit board is that the soft solder 6 used for bonding the heat sink 8 and the first copper plate 1 has a relatively large thermal resistance. This results in a problem to be solved in that the heat generated from the semiconductor chips, etc. cannot be effectively dissipated to the exterior from the heat sink 8. To solve the above problem, it is conceivable to bond the heat sink 8 and the first copper plate 1 together by brazing through a metal having a small value of thermal resistance. A brazing step using such a metal is generally required to be performed at a relatively high temperature. Brazing at high temperature increases internal stresses of the heat sink 8, the first and second copper plate 1, 2 and the ceramic substrate 3 after being bonded together. This raises a concern that the ceramic substrate 3, etc. may crack when the substrate temperature is changed between high and low temperatures repeatedly upon activation and deactivation of the semiconductor chips, etc.

SUMMARY OF THE INVENTION

Accordingly, one object of this invention is to provide a novel ceramic circuit board with a heat sink which has a long life under heat cycles.

Another object of the present invention is to provide a novel ceramic circuit board with a heat sink which has an improved characteristic of heat dissipation.

According to a first aspect of the present invention, a ceramic circuit board with a heat sink includes a ceramic substrate, first and second aluminum plates laminated and bonded onto both sides of the ceramic substrate through Al—Si-based brazing solders, respectively, and a heat sink formed of an AlSiC-based composite material and laminated and bonded onto a surface of the first or second aluminum plate.

With the circuit board according to the first aspect, since the first and second aluminum plates have a smaller resistance against deformation than copper plates conventionally used, no cracks occur in the ceramic substrate although a circuit board is subjected to heat cycles. Further, since the AlSiC-based composite material having high thermal conductivity is used for the heat sink, a characteristic of heat dissipation is improved.

According to a second aspect of the present invention, in the circuit board of the first aspect, the ceramic substrate is formed of AlN, Si$_3$N$_4$ or Al$_2$O$_3$.

With the circuit board according to the second aspect, the ceramic substrate is improved in thermal conductivity and heat resistance when formed of AlN, in strength and heat resistance when formed of Si$_3$N$_4$, and in heat resistance when formed of Al$_2$O$_3$.

According to a third aspect of the present invention, in the circuit board of the first or second aspect, an Al alloy in the heat sink has an Al purity of 80–95% or 80–99% by weight, the first or second aluminum plate onto which the heat sink is laminated and bonded has an Al purity not less than 99.98% by weight, and the heat sink is laminated and bonded onto the first or second aluminum plate through the Al alloy in the heat sink.

With the circuit board according to the third aspect, the heat sink can be laminated and bonded onto the first or second aluminum plate without using any brazing solder or soft solder. The number of manufacture steps can be therefore reduced.

According to a fourth aspect of the present invention, in the circuit board of the first or second aspect, the Al alloy in the heat sink has an Al purity of 80–95% or 80–99% by weight and the first or second aluminum plate onto which the heat sink is laminated and bonded has an Al purity not less than 99.98% by weight, and the heat sink is laminated and bonded onto the first or second aluminum plate through an Al—Si-based brazing solder having a lower melting point than the heat sink and the first or second aluminum plate.

With the circuit board according to the fourth aspect, even when the Al alloy in the heat sink has a relatively low Al purity, the heat sink can be relatively easily laminated and bonded onto the first or second aluminum plate. Because the Al purity of the Al alloy in the heat sink is relatively low, the heat sink has a larger resistance against deformation than results with a higher Al purity. But, the deformation resistance of the heat sink is yet smaller than that of a heat sink formed of a copper plate. Accordingly, cracks hardly occur in the ceramic substrate although a circuit board is subjected to heat cycles.

According to a fifth aspect of the present invention, in the circuit board of the first or second aspect, the first or second aluminum plate onto which the heat sink is laminated and bonded has an Al purity not less than 99.98% by weight, and the heat sink is laminated and bonded onto the first or second aluminum plate through a soft solder.

With the circuit board according to the fifth aspect, the heat sink can be easily laminated and bonded onto the first or second aluminum plate at a relatively low temperature.

According to a sixth aspect of the present invention, an improvement is made in a ceramic circuit board with a heat sink which includes a multilayer structure formed by laminating and bonding first and second aluminum plates or first and second copper plates onto both sides of a ceramic substrate, the structure being bonded to a heat sink through the aluminum plate or the copper plate.

The circuit board of the sixth aspect is featured in that the structure and the heat sink are bonded to each other through an aluminum foil having a purity not less than 99% by weight and including Al-melting-point lowering layers formed on both sides of the aluminum foil.

According to a seventh aspect of the present invention, in the circuit board of the sixth aspect, the Al-melting-point lowering layers are Al—Si alloy layers, Al—Cu alloy layers, Al—Mg alloy layers, Al—Ni alloy layers, Al—Ag alloy layers or Al—Ce alloy layers.

With the circuit board according to the sixth or seventh aspect, a characteristic of heat dissipation is improved because the heat sink is bonded to the aluminum plate or the copper plate by using the aluminum foil having a purity not less than 99% by weight and a high thermal conductivity instead of the background brazing solder or soft solder. Also, the provision of the Al-melting-point lowering layers enables the bonding to be achieved at a lower temperature than the melting point of Al. Further, since the aluminum foil has a small resistance against deformation, no cracks occur in the ceramic substrate although the circuit board after the bonding is subjected to heat cycles. It is thus possible to prolong a life of the circuit board.

According to an eighth aspect of the present invention, in the circuit board of the sixth or seventh aspect, Ni platings are formed on respective surfaces and the heat sink to be bonded to the aluminum foil.

With the circuit board according to the eighth aspect, the provision of the Ni platings enables the heat sink to be easily bonded to the aluminum plate or the copper plate at a relatively lower temperature.

According to a ninth aspect of the present invention, in the circuit board of any one of the sixth to eighth aspects, the ceramic substrate is formed of AlN, $Si_3N_4$ or $Al_2O_3$, and the heat sink is formed of Cu, Al or an AlSiC-based composite material.

With the circuit board according to the ninth aspect, the ceramic substrate is improved in thermal conductivity and heat resistance when formed of AlN, in strength and heat resistance when formed of $Si_3N_4$, and in heat resistance when formed of $Al_2O_3$. Also, with the heat sink formed of Cu, Al or an AlSiC-based composite material, the heat generated from semiconductor chips, etc. can be effectively dissipated through the heat sink.

According to a tenth aspect of the present invention, in the circuit board of any one of the sixth to eighth aspects, the aluminum foil has a thickness of 5–500 μm.

If the thickness of the aluminum foil is less than 5 μm, a difficulty arises in bonding the structure and the heat sink to each other. If the thickness of the aluminum foil exceeds 500 μm, a thermal resistance value of the aluminum foil is too increased.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

A first embodiment of the present invention will be described below in detail with reference to the drawings.

(a-1) Laminating and Bonding onto Ceramic Substrate

First and second aluminum plates are each formed of an aluminum alloy with high Al purity not less than 99.98% by weight, and a ceramic substrate is formed of AlN, $Si_3N_4$ or $Al_2O_3$.

Figure 1:
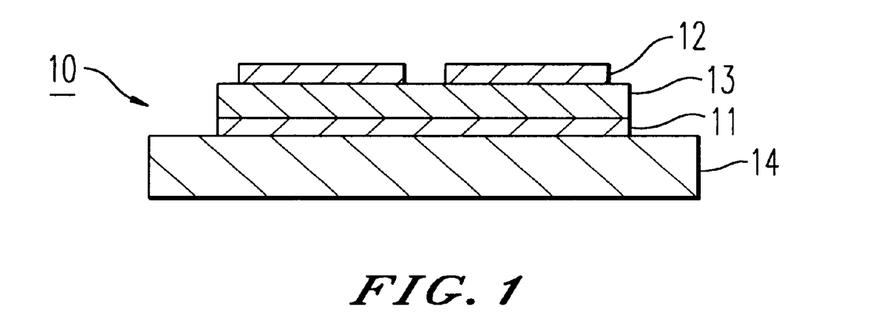
FIG. 1 is a sectional view of a ceramic circuit board with a heat sink according to a first embodiment and Example 1 of the present invention.

As shown in FIG. 1, first and second aluminum plates 11, 12 are laminated and bonded onto both sides of a ceramic substrate 13. Specifically, in a condition that an Al—Si-based brazing solder (not shown), the ceramic substrate 13, and an Al—Si-based brazing solder (not shown) and the second aluminum plates 12 are placed successively over the first aluminum plate 11, the assembly is subjected to a load of 0.5–5 kgf/cm$^2$ and is heated to 600–630° C. in a vacuum. After the above laminating and bonding steps, the second aluminum plate 12 is patterned by etching to have a circuit with a predetermined pattern. The Al—Si-based brazing solder is an alloy consisting of Al of 90–95% by weight and Si of 5–10% by weight.

(b-1) Heat Sink

A heat sink 14 is formed by holding powder of SiC prior to firing in a pressed state, and causing an Al alloy to flow into gaps between powder particles. This Al alloy has an Al purity of 80–95% or 80–99% by weight lower than the Al purity of the first and second aluminum plates 11, 12. As the remaining components, the Al alloy may also contain Si of 20–5% by weight and Mg or Cu of 0–5% by weight. The melting temperature of the Al alloy in the heat sink 14 ranges from 560–600° C.

The Al alloy in the heat sink 14 may have other suitable compositions, e.g., Al-20% by weight Si-4% by weight Mg, Al-7% by weight, Si, Al-4% by weight Cu, and Al-12% by weight Si.

(c-1) Laminating and Bonding of Heat Sink onto First Aluminum Plate

The ceramic substrate 13 with the first aluminum plate 11 facing downward is placed on the heat sink 14. The assembly is subjected to a load of 0.5–5 kgf/cm$^2$ and is heated to 570–610° C. in a vacuum. As a result, the Al alloy in the heat sink 14 is melted and the heat sink 14 is bonded to the first aluminum plate 11 for lamination.

Incidentally, the above embodiment may be modified such that the first aluminum plate 11 is patterned by etching to have a circuit with a predetermined pattern, while the heat sink 14 is laminated and bonded onto the second aluminum plate 12.

Figure 2:
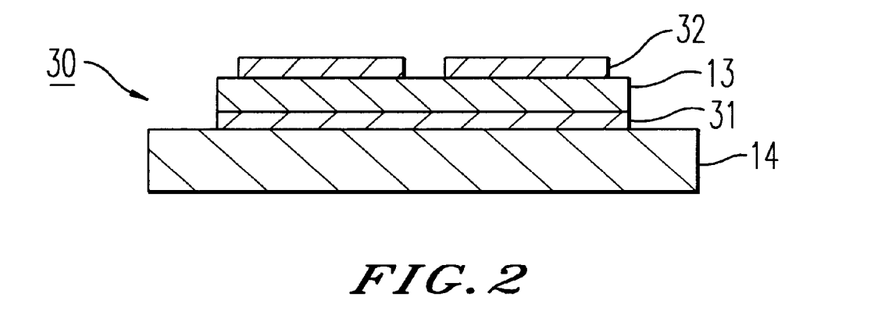
FIG. 2 is a sectional view corresponding to FIG. 1, the view showing a second embodiment of the present invention.

FIG. 2 shows a second embodiment of the present invention. In FIG. 2, the same reference numerals as those in FIG. 1 denote the same parts.

In this second embodiment, an Al alloy in a heat sink 14 has an Al purity of 80–95% or 80–99%, and a first aluminum plate 31 onto which the heat sink 14 is laminated and bonded has an Al purity not less than 99.98% by weight. The heat sink 14 is laminated and bonded onto the first aluminum plate 31 through an Al—Si-based brazing solder (not shown) which has a lower melting point than the heat sink 14 and the first aluminum plate 31. A second aluminum plate 32 is formed of the same material as used for the first aluminum plate 31. The first and second aluminum plates 31, 32 are each laminated and bonded onto a ceramic substrate 13 by using the above Al—Si-based brazing solder. The Al alloy in the heat sink 14 contains Al of 80–95% or 80–99% by weight and Si of 20–5% or 20–1% by weight. The melting temperature of the Al alloy ranges from 560–600° C. Further, each of the first and second aluminum plates 31, 32 contains Al of not less than 99.98% by weight and has a melting point of 660° C. Additionally, the Al—Si-based brazing solder contains Al of 87–84% by weight and Si of 11–13.5% by weight. The melting temperature of the Al—Si based brazing solder ranges from 530–570° C.

A ceramic circuit board 30 of this embodiment is manufactured as follows. First, one Al—Si-based brazing solder, the first aluminum plate 31, another Al—Si-based brazing solder, the ceramic substrate 13, still another Al—Si-based brazing solder and the second aluminum plate 32 are placed successively over the heat sink 14. Then, the assembly in such a multilayered condition is subjected to a load of 0.5–5 kgf/cm$^2$ and is heated to 550–570° C. in a vacuum. As a result, the Al—Si-based brazing solder is melted and the heat sink 14 is bonded to the first aluminum plate 31 for lamination. After that, the second aluminum plate 32 is patterned by etching to have a circuit with a predetermined pattern.

Incidentally, the above embodiment may be modified such that the second aluminum plate 32 is first laminated on the heat sink 14 through the Al—Si-based brazing solder. In this case, the first aluminum plate 31 is patterned by etching to have a circuit with a predetermined pattern.

Figure 3:
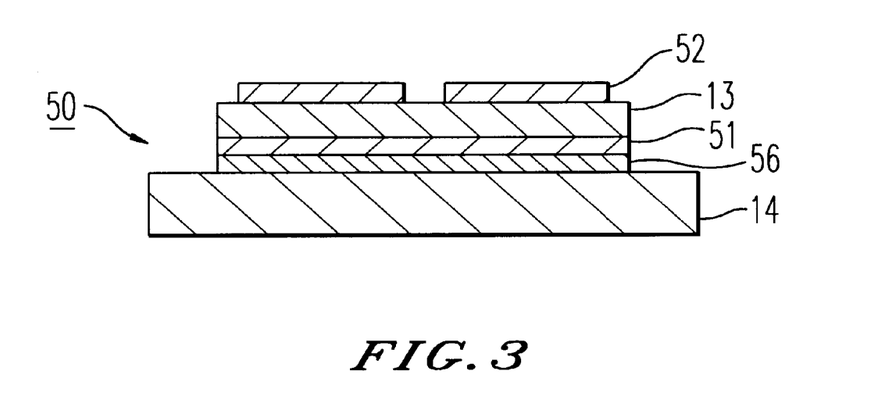
FIG. 3 is a sectional view corresponding to FIG. 1, the view showing a third embodiment of the present invention.

FIG. 3 shows a third embodiment of the present invention. In FIG. 3, the same reference numerals as those in FIG. 1 denote the same parts.

In a ceramic circuit board 50 of this embodiment, a heat sink 14 is laminated and bonded onto a first aluminum plate 51 through a soft solder (pewter) 56. In this embodiment, an Al alloy in the heat sink 14 has no particular restrictions on Al purity, but each of first and second aluminum plates 51, 52 has an Al purity not less than 99.98% by weight. The soft solder 56 is an alloy consisted of Pb of 5–60% by weight and Sn of 95–40% by weight. The first and second aluminum plates 51, 52 are laminated and bonded onto both sides of a ceramic substrate 13 as follows. First, an Al—Si-based brazing solder (not shown), the ceramic substrate 13, an Al—Si-based brazing solder (not shown) and the second aluminum plate 52 are placed successively over the first aluminum plate 51. Then, the assembly in such a multilayered condition is subjected to a load of 0.5–5 kgf/cm$^2$ and is heated to 600–630° C. in a vacuum. After the above laminating and bonding steps, the second aluminum plate 52 is patterned by etching to have a circuit with a predetermined pattern.

Next, Ni platings are formed on respective bonding surfaces of the first aluminum plate 51 and the heat sink 14. Further, in a condition that the soft solder 56 and the ceramic substrate 13 with the first aluminum plate 51 facing downward are placed successively over the heat sink 14, the assembly is heated to 220–350° C. in a gas mixture atmosphere of N$_2$ gas and H$_2$ gas. As a result, the heat sink 14 is bonded to the first aluminum plate 51 for lamination.

Incidentally, the above embodiment may be modified such that the first aluminum plate 51 is patterned by etching to have a circuit with a predetermined pattern, while the second aluminum plate 52 is laminated on the heat sink 14 through a soft solder foil.

Figure 4:
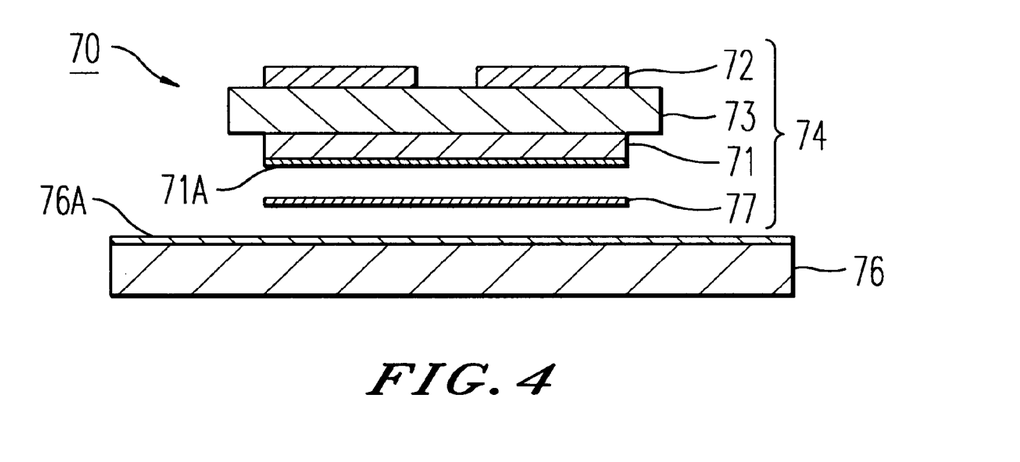
FIG. 4 is a sectional view corresponding to FIG. 1, the view showing a fourth embodiment of the present invention.
Figure 8:
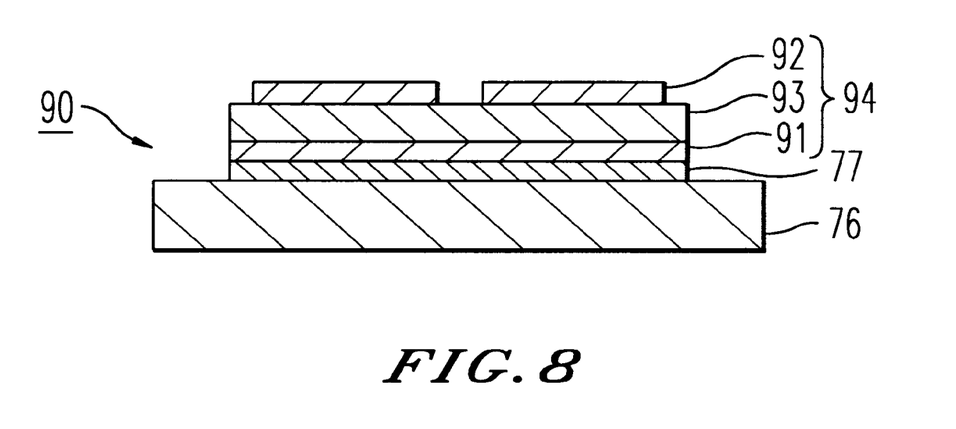
FIG. 8 is a sectional view corresponding to FIG. 1, the view showing a fifth embodiment of the present invention.

FIGS. 4 and 8 show fourth and fifth embodiments of the present invention, respectively.

(a-2) Laminating and Bonding onto Ceramic Substrate

As shown in FIGS. 4 and 8, multilayer structures 74, 94 are constructed by laminating and bonding first and second aluminum plates 71, 72 or first and second copper plates 91, 92 onto both sides of ceramic substrates 73, 93, respectively. The ceramic substrates 73, 93 are each formed of AlN, Si$_3$N$_4$ or Al$_2$O$_3$.

The first and second aluminum plates 71, 72 are laminated and bonded onto both sides of the ceramic substrate 73, as shown in FIG. 4, as follows. In a condition that an Al—Si-based brazing solder (not shown), the ceramic substrate 73, an Al—Si-based brazing solder (not shown), the ceramic substrate 73, an Al—Si-based brazing solder (not shown) and the second aluminum plate 72 are placed successively over the first aluminum plate 71, the assembly is subjected to a load of 0.5–5 kgf/cm$^2$ and is heated to 600–630° C. in a vacuum. After the above laminating and bonding steps, the second aluminum plate 72 is patterned by etching to have a circuit with a predetermined pattern. The Al—Si-based brazing solder is preferably an alloy consisted of Al of 90–95% by weight and Si of 5–10% by weight.

The first and second copper plates 91, 92 are laminated and bonded onto both sides of the ceramic substrate 93 with a DBC (Direct Bond Copper) process, as shown in FIG. 8. Specifically, in a condition that the ceramic substrate 93 and the second copper plate 92 are placed successively over the first copper plate 91, the assembly is subjected to a load of 0.5–2 kgf/cm$^2$ and is heated to 1065–1075° C. in an N$_2$ atmosphere. The second copper plate 92 of the structure 94 is then patterned by etching to have a circuit with a predetermined pattern.

(b-2) Heat Sink

A heat sink 76 is formed of Cu, Al or an AlSiC-based composite material. When the heat sink 76 is formed of the AlSiC-based composite material, it is produced by holding powder of SiC prior to firing in a pressed state, and causing an Al alloy to flow into gaps between powder particles.

(c-2) Aluminum Foil

Figure 5:
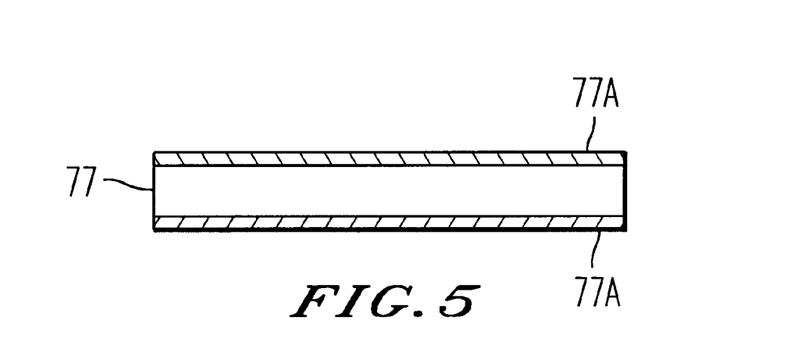
FIG. 5 is a sectional view of an aluminum foil with Al-melting-point lowering layers formed thereon.
Figure 6:
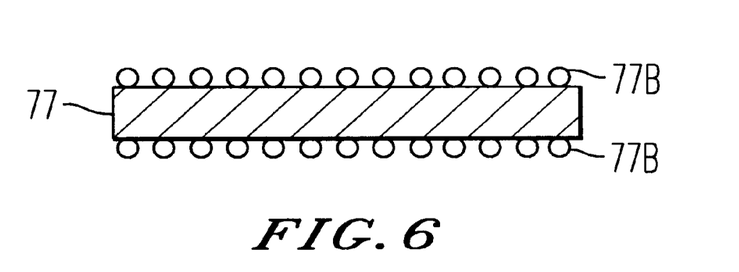
FIG. 6 is a sectional view of an aluminum foil with Al-melting point lowering layers formed thereon.

An aluminum foil 77 is formed of an aluminum foil having a purity not less than 99% by weight. As shown in FIG. 5, the aluminum foil 77 is covered by Al-melting-point lowering layers 77a, 77a formed on both sides thereof. The aluminum foil 77 has a thickness of 5–500 μm and the Al-melting-point lowering layer 77a is formed of an Al—Si alloy layer, an Al—Cu alloy layer, an Al—Mg alloy layer, an Al—Ni alloy layer, an Al—Ag alloy layer or an Al—Ce alloy layer. The Al-melting-point lowering layer 77a can be formed on the aluminum foil 77 by coating the Al-melting-point lowering layer 77a on the aluminum foil 77, as shown in FIG. 5. Alternatively, an Al-melting-point lowering layer 77b made up of fine particles may be deposited on the aluminum foil 77 by vaporization or the like.

(d-2) Bonding of the Heat Sink to First Aluminum Plate or First Copper Plate

Figure 7:
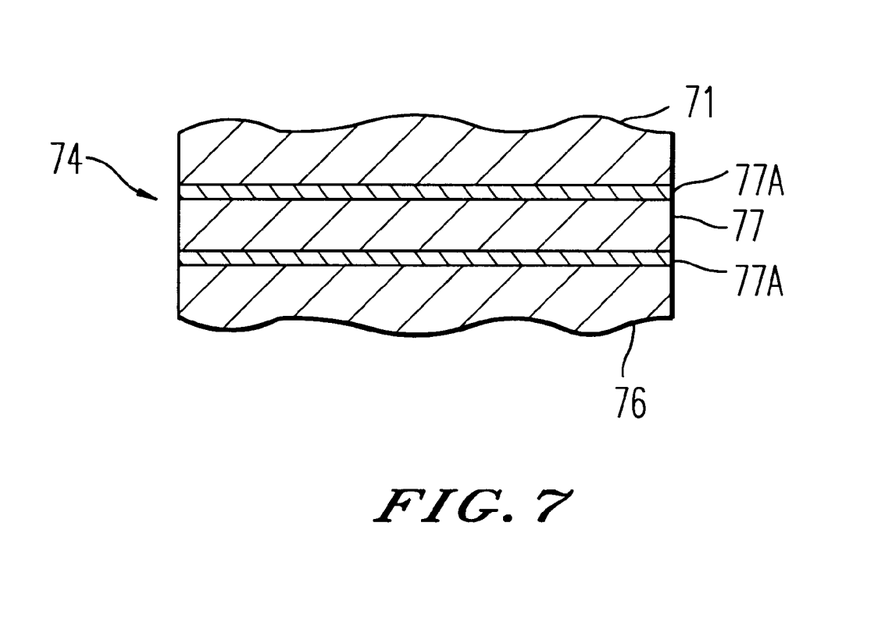
FIG. 7 is a sectional view showing a state that a multilayer structure and a heat sink are bonded to each other through the aluminum foil.

The multilayer structure 74, 94 with the first aluminum plate 71 or the first copper plate 91 facing downward is placed on the heat sink 76 through the aluminum foil 77. The assembly is subjected to a load of 3 kgf/cm² and is heated to and retained at 520–570° C. in a vacuum. As a result, the Al alloy in the Al-melting-point lowering layers 77a formed on both sides of the aluminum foil 77 is melted and the heat sink 76 is bonded to the structure 74, 94 through the aluminum foil 77, as shown in FIG. 7.

Incidentally, the above embodiments may be each modified such that the first aluminum plate 71 or the first copper plate 91 is patterned by etching to have a circuit with a predetermined pattern, while the heat sink 76 is bonded to the second aluminum plate 72 or the second copper plate 92 through the aluminum foil 77.

EXAMPLES

Examples of the present invention will be described below in detail along with Comparative Examples.

Example 1

Prepared were, as seen from FIG. 1, a ceramic substrate 13 formed of AlN and being 60 mm long, 40 mm wide and 0.635 mm thick, first and second aluminum plates 11, 12, each formed of an Al alloy and being 60 mm long, 40 mm wide and 0.4 mm thick, heat sink 14 formed of an AlSiC-based composite material and being 80 mm long, 60 mm wide and 2.0 mm thick, and two pieces of Al—Si-based brazing solders (not shown) being 60 mm long, 40 mm wide and 0.03 mm thick. The first and second aluminum plates 11, 12 each had an Al purity of 99.99% by weight, the Al alloy in the heat sink 14 was an alloy of 88% by weight Al-12% by weight Si, and the Al—Si-based brazing solders were each an alloy of Al-7.5% by weight Si. The melting temperature of the alloy in the heat sink 14 ranged from 560–600° C.

First, one Al—Si-based brazing solder, the ceramic substrate 13, the other Al—Si-based brazing solder and the second aluminum plate 12 were placed successively over the first aluminum plate 11. Then, the assembly in such a multilayered condition was subjected to a load of 2 kgf/cm² and was heated to 630° C. in a vacuum. As a result, the first and second aluminum plates 11, 12 were bonded to both sides of the ceramic substrate 13 for lamination. After the laminating and bonding steps, the second aluminum plate 12 was patterned by etching to have a circuit with a predetermined pattern.

Next, the ceramic substrate 13 with the first aluminum plate 11 facing downward was placed on the heat sink 14. The assembly was subjected to a load of 2 kgf/cm² and was heated to 580° C. in a vacuum. As a result, the heat sink 14 was bonded to the first aluminum plate 11 for lamination and a ceramic circuit board 10 with a heat sink 14 was obtained.

Example 2

For fabricating the multilayer structure 74, as shown in FIG. 4, prepared were a ceramic substrate 73 formed of AlN and being 50 mm long, 50 mm wide and 0.6 mm thick, first and second aluminum plates 71, 72 each formed of Al and being 30 mm long, 30 mm wide and 0.4 mm thick, and two pieces of Al—Si-based brazing solders (not shown) formed of an Al-7.5% by weight Si alloy and being 30 mm long, 30 mm wide and 0.03 mm thick.

The structure 74 was fabricated as follows. First, one Al—Si-based brazing solder, the ceramic substrate 73, the other Al—Si-based brazing solder and the second aluminum plate 72 were placed successively over the first aluminum plate 71. Then, the assembly in such a multilayered condition was subjected to a load of 2 kgf/cm² and was heated to 630° C. in a vacuum. As a result, the first and second aluminum plates 71, 72 were bonded to both sides of the ceramic substrate 73 for lamination. After the laminating and bonding steps, the second aluminum plate 72 was patterned by etching to have a circuit with a predetermined pattern.

In addition to the structure 74, prepared were a heat sink 76 formed of an AlSiC-based composite material and being 70 mm long, 70 mm wide and 2.0 mm thick, and aluminum foil 77 having a purity not less than 99% by weight and being 30 mm long, 30 mm wide and 0.1 mm thick, the aluminum foil 77 being covered by the Al-melting-point lowering layers 77a formed on both sides. The Al-melting-point lowering layers 77a were formed on both surfaces of the aluminum foil 77 in a thickness of 0.05 mm by coating an Al-7.5% by weight Si alloy thereon.

Ni platings 71a, 76a with a thickness of 0.005 mm were formed on respective surfaces of the first aluminum plate 71 and the heat sink 76 of the structure 74 to be bonded to the aluminum foil 77. Then, the structure 74 with the first aluminum plate 71 facing downward was placed on the heat sink 76 through the aluminum foil 77. The assembly was subjected to a load of 2 kgf/cm² and was heated to 530° C. in a vacuum, followed by being left to stand in that condition for two hours. As a result, the heat sink 76 was bonded to the first aluminum plate 71 through the aluminum foil 77 and a ceramic circuit board 70 with a heat sink was obtained.

Example 3

Though not shown, the same multilayer structure and the heat sink as used in Example 2 were prepared. Then, the aluminum foil 77 having a purity not less than 99% by weight, being 30 mm long, 30 mm wide and 0.2 mm thick and covered by the Al-melting-point lowering layers 77b formed on both sides was prepared. The Al-melting-point lowering layers 77b were formed by press-bonding powder of an Al-7.5% by weight Si alloy (particle size of 1.0 μm) onto the aluminum foil.

Ni platings with a thickness of 0.003 mm were formed on respective surfaces of the first aluminum plate and the heat sink of the multilayer structure to be bonded to the aluminum foil. Then, the multilayer structure with the first aluminum plate facing downward was placed on the heat sink through the aluminum foil. The assembly was subjected to a load of 2 kgf/cm² and was heated to 520° C. in a vacuum, followed by being left to stand in that condition for two hours. As a result, the heat sink was bonded to the first aluminum plate through the aluminum foil and a ceramic unit board with a heat sink was obtained.

Example 4

Though not shown, the same ceramic circuit board with the heat sink as in Example 2 was fabricated except that no Ni platings were formed on the respective surfaces of the first aluminum plate and the heat sink of the multilayer structure to be bonded to the aluminum foil.

More specifically, without carrying out any treatment on the respective surfaces of the first aluminum plate and the heat sink of the multilayer structure to be bonded to the aluminum foil, the multilayer structure with the first aluminum plate facing downward was placed on the heat sink through the same aluminum foil as used in Example 2. The assembly was subjected to a load of 2 kgf/cm² and was heated to 520° C. in a vacuum, followed by being left to stand in that condition for two hours. As a result, the heat sink was bonded to the first aluminum plate through the aluminum foil and a ceramic circuit board with a heat sink was obtained.

Example 5

Though not shown, the same multilayer structure as used in Example 2 was fabricated except that the ceramic substrate was formed of $Si_3N_4$. More specifically, a ceramic substrate formed of $Si_3N_4$ and being 50 mm long, 50 mm wide and 0.6 mm thick was prepared in addition to first and second aluminum plates and two pieces of Al—Si-based brazing solders which are the same as used in Example 2. One Al—Si-based brazing solder, the ceramic substrate formed of $Si_3N_4$, the other Al—Si-based brazing solder and the second aluminum plate were placed successively over the first aluminum plate. Then, the assembly in such a multilayered condition was subjected to a load of 3 kgf/cm² and was heated to 640° C. in a vacuum. As a result, the first and second aluminum plates were bonded to both sides of the ceramic substrate for lamination. After the laminating and bonding steps, the second aluminum plate was patterned by etching to have a circuit with a predetermined pattern. A multilayer structure was thereby obtained.

In addition to that multilayer structure, prepared were a heat sink formed of Al and being 70 mm long, 70 mm wide and 2.0 mm thick, and an aluminum foil having a purity not less than 99% by weight and being 30 mm long, 30 mm wide and 0.1 mm thick, the aluminum foil being covered by Al-melting-point lowering layers of an Al—Cu alloy formed on both sides. The melting-point lowering layers of an Al—Cu alloy were formed on both surfaces of the aluminum foil 77 in a thickness of 0.008 mm by coating an Al-5% by weight Si alloy thereon.

Ni platings with a thickness of 0.005 mm were formed on respective surfaces of the first aluminum plate and the heat sink of the multilayer structure to be bonded to the aluminum foil. Then, the multilayer structure with the first aluminum plate facing downward was placed on the heat sink formed of Al through the aluminum foil. The assembly was subjected to a load of 3 kgf/cm² and was heated to 570° C. in a vacuum, followed by being left to stand in that condition for two hours. As a result, the heat sink was bonded to the first aluminum plate through the aluminum foil and a ceramic circuit board with a heat sink was obtained.

Example 6

Though not shown, the same multilayer structure as used in Example 2 was fabricated except that a ceramic substrate was formed of $Al_2O_3$. More specifically, a ceramic substrate formed of $Al_2O_3$ and being 50 mm long, 50 mm wide and 0.6 mm thick was prepared in addition to first and second aluminum plates and two pieces of Al—Si-based brazing solders which are the same as used in Example 2. One Al—Si-based brazing solder, the ceramic substrate formed of $Al_2O_3$, the other Al—Si-based brazing solder and the second aluminum plate were placed successively over the first aluminum plate. Then, the assembly in such a multilayered condition was subjected to a load of 2 kgf/cm² and was heated to 630° C. in a vacuum. As a result, the first and second aluminum plates were bonded to both sides of the ceramic substrate for lamination. After the laminating and bonding steps, the second aluminum plate was patterned by etching to have a circuit with a predetermined pattern. A multilayer structure was thereby obtained.

In addition to that multilayer structure, prepared were a heat sink formed of Cu and being 70 mm long, 70 mm wide and 2 mm thick, and an aluminum foil having a purity not less than 99% by weight and being 30 mm long, 30 mm wide and 0.2 mm thick, the aluminum foil being covered by Al-melting-point lowering layers of an Al—Mg alloy formed on both sides. The melting point lowering layers of an Al—Mg alloy were formed on both surfaces of the aluminum foil in a thickness of 0.004 mm by coating an Al-6% by weight Mg alloy thereon.

Ni platings with a thickness of 0.008 were formed on respective surfaces of the first aluminum plate and the heat sink of the multilayer structure to be bonded to the aluminum foil. Then, the multilayer structure with the first aluminum plate facing downward was placed on the heat sink formed of Cu through the aluminum foil. The assembly was subjected to a load of 3 kgf/cm² and was heated to 520° C. in a vacuum, followed by being left to stand in that condition for three hours. As a result, the heat sink was bonded to the first aluminum plate through the aluminum foil and a ceramic circuit board with a heat sink was obtained.

Example 7

For fabricating the multilayer structure 94, as shown in FIG. 8, prepared were a ceramic substrate 93 formed of AlN and being 50 mm long, 50 mm wide and 0.6 mm thick, and the first and second aluminum plates 91, 92 each formed of a Cu alloy and being 70 mm long, 70 mm wide and 2 mm thick.

The structure 94 was fabricated with a DBC (Direct Bond Copper) process as follows. Specifically, in a condition that the ceramic substrate 93 and the second copper plate were placed successively over the first copper plate 91, the assembly was subjected to a load of 0.5–2 kgf/cm² and was heated to 1065–1075° C. in an $N_2$ atmosphere. The second copper plate 92 was then patterned by etching to have a circuit with a predetermined pattern. The structure 94 was thereby obtained.

In addition to the structure 94, prepared were a heat sink 76 formed of an AlSiC-based composite material and being 70 mm long, 70 mm wide and 3.0 mm thick, and an aluminum foil 77 having a purity not less than 99% by weight and being 30 mm long, 30 mm wide and 0.3 mm thick, the aluminum foil 77 being covered by the Al-melting-point lowering layers of an Al—Ni alloy formed on both sides thereof. The Al-melting point lowering layers were formed on both surfaces of the aluminum foil 77 in a thickness of 0.05 mm by coating an Al-3% by weight Ni alloy thereon.

Ni platings with a thickness of 0.005 were formed on respective surfaces of the first aluminum plate 91 and the heat sink 76 of the structure 84 to be bonded to the aluminum foil 77. Then, the structure 94 with the first copper plate facing downward was placed on the heat sink 76 formed of an AlSiC-based composite material through the aluminum foil 77. The assembly was subjected to a load of 3 kgf/cm² and was heated to 530° C. in a vacuum, followed by being left to stand in that condition for three hours. As a result, the heat sink 76 was bonded to the first copper plate 91 through the aluminum foil 77 and a ceramic circuit board 90 with a heat sink was obtained.

Example 8

Though not shown, the same multilayer structure as used in Example 7 was fabricated except that the ceramic substrate was formed of $Si_3N_4$. More specifically, a ceramic substrate formed of $Si_3N_4$ and being 50 mm long, 50 mm wide and 0.6 mm thick was prepared in addition to first and second copper plates which are the same as used in Example 7. The ceramic substrate formed of $Si_3N_4$ and the second copper plate were placed successively over the first copper plate. Then, the assembly in such a multilayered condition was subjected to a load of 0.5–2 kgf/cm$^2$ and was heated to 1065–1075° C. in an $N_2$ atmosphere for bonding of the first and second copper plates to both sides of the ceramic substrate for lamination. After that, the second copper plate was patterned by etching to have a circuit with a predetermined pattern. A multilayer structure was thereby obtained.

In addition to that multilayer structure, prepared were a heat sink formed of Al and being 70 mm long, 70 mm wide and 2 mm thick, and an aluminum foil having a purity not less than 99% by weight and being 30 mm long, 30 mm wide and 0.2 mm thick, the aluminum foil being covered by Al-melting-point lowering layers of an Al—Ag alloy formed on both sides. The melting-point lowering layers of an Al—Ag alloy were formed on both surfaces of the aluminum foil in a thickness of 0.2 mm by coating an Al-4% by weight Ag alloy thereon.

Ni platings with a thickness of 0.01 were formed on respective surfaces of the first copper plate and the heat sink of the multilayer structure to be bonded to the aluminum foil. Then, the multilayer structure with the first copper plate facing downward was placed on the heat sink formed of Al through the aluminum foil. The assembly was subjected to a load of 3 kgf/cm$^2$ and was heated to 530° C. in a vacuum followed by being left to stand in that condition for five hours. As a result, the heat sink was bonded to the first copper plate through the aluminum foil and a ceramic circuit board with a heat sink was obtained.

Example 9

Though not shown, the same multilayer structure as used in Example 7 was fabricated except that the ceramic substrate was formed of $Al_2O_3$. More specifically, a ceramic substrate formed of $Al_2O_3$ and being 50 mm long, 50 mm wide and 0.6 mm thick was prepared in addition to first and second copper plates which are the same as used in Example 7. The ceramic substrate formed of $Al_2O_3$ and the second copper plate were placed successively over the first copper plate. Then, the assembly in such a multilayered condition was subjected to a load of 0.5–2 kgf/cm$^2$ and was heated to 1065–1075° C. in an $N_2$ atmosphere for bonding of the first and second copper plates to both sides of the ceramic substrate for lamination. After that, the second copper plate was patterned by etching to have a circuit with a predetermined pattern. A multilayered structure was thereby obtained.

In addition to that multilayer structure, prepared were a heat sink formed of Cu and being 70 mm long, 70 mm wide and 2 mm thick, and an aluminum foil having a purity of not less than 99% by weight and being 30 mm long, 30 mm wide and 0.1 mm thick, the aluminum foil being covered by Al-melting-point lowering layers of an Al—Ce alloy formed on both sides. The melting-point lowering layers of an Al—Ce alloy were formed on both surfaces of the aluminum foil in a thickness of 0.05 mm by coating an Al-7% by weight Ce alloy thereon.

Ni platings with a thickness of 0.007 mm were formed on respective surfaces of the first copper plate and the heat sink of the multilayer structure to be bonded to the aluminum foil. Then, the multilayer structure with the first copper plate facing downward was placed on the heat sink formed of Cu through the aluminum foil. The assembly was subjected to a load of 4 kgf/cm$^2$ and was heated to 525° C. in a vacuum, followed by being left to stand in that condition for one hour. As a result, the heat sink was bonded to the first copper plate through the aluminum foil and a ceramic circuit board with a heat sink was obtained.

Comparative Example 1

Figure 9:
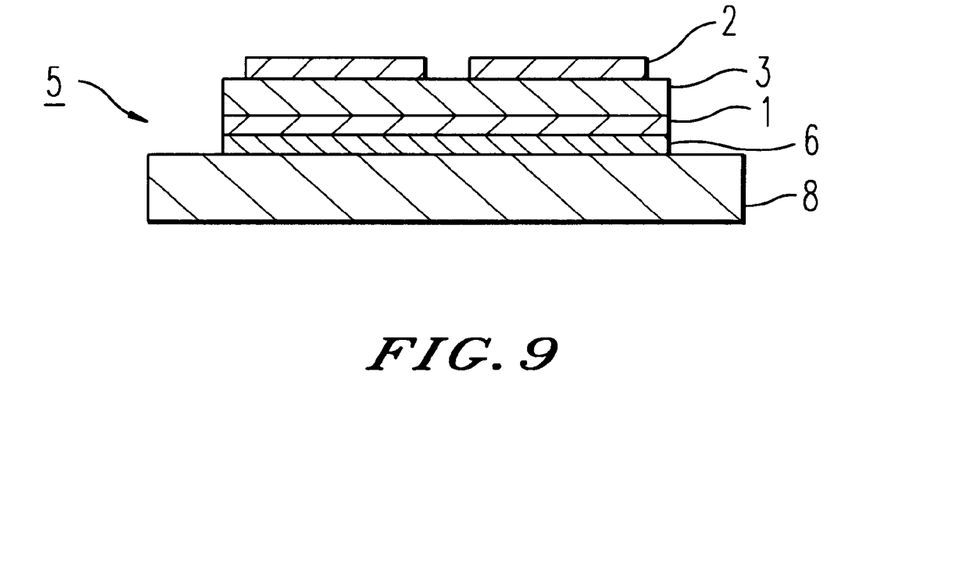
FIG. 9 is a sectional view corresponding to FIG. 1, the view showing a ceramic circuit board with a heat sink according to Comparative Example 1.

As seen from FIG. 9, prepared were the ceramic substrate 3 formed of the same material and having the same shape and size as the ceramic substrate used in Example 1, the first and second copper plates 1, 2 having the same shape and size as the first and second aluminum plates used in Example 1, the heat sink 8 formed of Cu and having the same shape and size as the heat sink used in Example 1, and the soft solder 6 being 50 mm long, 30 mm wide and 0.1 mm thick.

The first and second copper plates 1, 2 were laminated and bonded onto the ceramic substrate 3 with the DBC process as follows. Specifically, in a condition that the ceramic substrate 3 and the second copper plate 2 were placed successively over the first copper plate 1, the assembly was subjected to a load of 0.5 kgf/cm$^2$ and was heated to 1063° C. in an $N_2$ atmosphere. The second copper plate 2 was then patterned by etching to have a circuit with a predetermined pattern. After that, the soft solder 6 and the ceramic substrate 3 with the first copper plate 1 facing downward was placed on the heat sink 8. The assembly was heated to 250° C. in a gas mixture atmosphere of $N_2$ gas and $H_2$ gas. As a result, the heat sink 8 was bonded to the first copper plate 1 for lamination. A resulting ceramic circuit board 5 with a heat sink was given as Comparative Example 1.

Comparative Example 2

As shown in FIG. 10, a circuit board was fabricated in the same manner as in Comparative Example 1 except that the heat sink 8 was formed of an AlSiC-based composite material, and a Ni plating was formed on the bonding surface of the heat sink 8 before the heat sink 8 was laminated and bonded onto the first copper plate 1 through the soft solder 6. A resulting ceramic circuit board 9 with a heat sink was given as in Comparative Example 2.

Comparative Example 2*

Though not shown, a circuit board was fabricated in the same manner as in Example 1 except that the ceramic substrate was formed only one upper aluminum plate without the lower aluminum plate. Then, the ceramic substrate was directly bonded with the heat sink. The bonded conditions were the same as the conditions of Example 1.

Comparative Example 3

Though not shown, prepared were a multilayer structure formed of the same material and having the same shape and size as the multilayer structure used in Example 7, a heat sink formed of the same material, i.e., Cu, and having the same shape and size as the heat sink used in Example 9, and a soft solder being 30 mm long, 30 mm wide and 0.1 mm thick.

First, the soft solder and the multilayer structure with the first copper plate facing downward was placed on the heat sink. Then, the assembly was heated to 250° C. in a gas mixture atmosphere of N2 gas and H$_2$ gas, whereby the heat sink was bonded to the first copper plate. A resulting ceramic circuit board with a heat sink was given as in Comparative Example 3.

Comparative Example 4

Though not shown, a circuit board was fabricated in the same manner as in Comparative Example 3 except that the heat sink was formed of an AlSiC-based composite material, and a Ni plating was formed on the bonding surface of the heat sink before the heat sink was laminated and bonded onto the first copper plate through the soft solder. A resulting ceramic board with a heat sink was given as in Comparative Example 4.

Note that particulars of the circuit boards of above Examples 2 to 9 and Comparative Examples 3, 4 are listed in Table 2 below.

Comparison Test and Evaluation

The circuit boards of Example 1 and Comparative Examples 1, 2, 2* were measured for warp, thermal resistance and ceramic cracks.

(1) Measurement of Warp

Warps of the lower surfaces of the heat sinks of Example 1 and Comparative Examples 1, 2, 2* were measured by using a three-dimensional gauge. The length over which warps were measured was 50 mm.

(2) Measurement of Thermal Resistance

A heating element of 20 mm×15 was bonded with silicone grease to each of the upper surface of the second aluminum plate in Example 1 and the upper surfaces of the second copper plates in Comparative Examples 1, 2, 2*, whereas a heat radiator was attached to the lower surface of each of the heat sinks. First, in this condition, the heating element was heated by supplying 30 W to it and thermal resistance (i.e., thermal resistance just before temperature cycles) was measured between the heating element and ambient air. Then, by using a cold-hot shock test device, the circuit boards of Example 1 and Comparative Examples 1, 2, 2* were subjected to 1000 temperature cycles on condition that one cycle covered the range of −55° C.~room temperature~150° C. After the 1000 temperature cycles, thermal resistance (i.e., thermal resistance after 1000 temperature cycles) was also measured between the heating element and ambient air by supplying 30 W to the heating element.

(3) Measurement of Ceramic Cracks

First, the first and second aluminum plates on the ceramic substrate of Example 1 and the first and second copper plates on each of the ceramic substrates of Comparative Examples 1, 2, 2* for which thermal resistance after 1000 temperature cycles had been measured, were removed by etching. Then, measurement was made on a proportion of the length over which cracks occurred in the ceramic substrate with respect to the total length of the ceramic substrate of Example 1 from which the aluminum plates had been removed, and a proportion of the length over which cracks occurred in the ceramic substrate with respect to the total length of the ceramic substrate of each of Comparative Examples 1, 2, 2* from which the copper plates had been removed.

Results of the above measurements (1) to (3) are listed in Table 1 below:

TABLE 1

| | Warp (μm) | Thermal Resistance (° C./W) | | Ceramic Cracks (%) | |
|---|---|---|---|---|---|
| | | just before temperature cycles | after 1000 temperature cycles | just before temperature cycles | after 1000 temperature cycles |
| Example 1 | 30 | 1.2 | 1.2 | 0 | 0 |
| Comparative Example 1 | 45 | 1.4 | 2.5 | 0 | 100 |
| Comparative Example 2 | 30 | 1.3 | 1.4 | 0 | 100 |
| Comparative Example 2* | 51 | 1.1 | 1.4 | 0 | 100 |

As is apparent from Table 1, the heat sinks of Example 1 and Comparative Examples 2, 2* shows warps of the same value, i.e., 30 μm. On the other hand, the heat sink of Comparative Example 1 shows a warp 1.5 times as large as the warps in Example 1 and Comparative Examples 2, 2*.

Also, in Example 1, the thermal resistance after 1000 temperature cycles was not changed from the thermal resistance just before temperature cycles. On the other hand, the thermal resistance after 1000 temperature cycles was increased about 78% in Comparative Example 1 and about 7.7% in Comparative Example 2.

Further, in Example 1, there occurred no ceramic cracks even after 1000 temperature cycles. On the other hand, ceramic cracks occurred at a proportion of 100% after 1000 temperature cycles in Comparative Examples 1, 2 and 2*. Stated otherwise, in Comparative Examples 1, 2 and 2*, cracks occurred in each of the ceramic substrates all over the area from which the copper plates were removed.

Further, in Example 2*, though the initial of the thermal resistance is lower than that of Example 1, the thermal resistance after 1000 temperature cycles was increased about 27%. Further, ceramic cracks occurred at a proportion of 100% after 1000 temperature cycles.

Comparison Test 2 and Evaluation

The circuit boards of Examples 2 to 9 and Comparative Examples 3, 4 were measured for thermal resistance and ceramic cracks.

Thermal resistance was measured as follows. A heating element of 20 mm×15 mm was bonded with silicone grease to each of the upper surfaces of the second copper plates in Comparative Examples 3, 4, whereas a heat radiator was attached to the lower surface of each of the heat sinks. First, in this condition, the heating element was heated by supplying 30 W to it and thermal resistance (i.e., thermal resistance just before temperature cycles) was measured between the heating element and ambient air. Then, by using a cold-hot shock test device, the circuit boards of Examples 2 to 9 and Comparative Examples 3, 4 were subjected to 1000 temperature cycles on condition that one cycle covered the range of −55° C.~room temperature~150° C. After the 1000 temperature cycles, thermal resistance (i.e., thermal resistance after 1000 temperature cycles) was also measured between the heating element and ambient air by supplying 30 W to the heating element. Measured results are listed in Table 2 below.

Cracks in the ceramic substrate were measured as follows. The first and second aluminum plates and the first and second copper plates on the ceramic substrates of Examples 2 to 9 and the first and second copper plates on each of the ceramic substrates of Comparative Examples 3, 4 for which thermal resistance after 1000 temperature cycles had been measured, were removed by etching. Then, whether cracks occurred in the ceramic substrates was examined by using a magnifying glass.

sion coefficient between the ceramic substrate and the aluminum plates. As a result, no cracks occur in the ceramic substrate. In addition, since the AlSiC-based composite material having high thermal conductivity is used for the heat sink, a characteristic of heat dissipation is improved.

When the ceramic substrate is formed of AlN, $Si_3N_4$ or $Al_2O_3$, it is improved respectively in thermal conductivity and heat resistance, in strength and heat resistance, and in heat resistance.

TABLE 2

| | Structure | | | Al-Melting Point lowering layer | Thermal Resistance (° C./W) | |
|---|---|---|---|---|---|---|
| | Ceramic Substrate | Plate | Heat Sink | | just before temperature cycles | after 1000 temperature cycles |
| Examples | | | | | | |
| 2 | AlN | Al | AlSiC-based | Al—Si | 0.40 | 0.40 |
| 3 | AlN | Al | AlSiC-based | Al—Si powder | 0.41 | 0.41 |
| 4 | AlN | Al | AlSiC-based without plating | Al—Si | 0.40 | 0.40 |
| 5 | $Si_3N_4$ | Al | Al | Al—Cu | 0.46 | 0.46 |
| 6 | $Al_2O_3$ | Al | Cu | Al—Mg | 0.67 | 0.67 |
| 7 | AlN | Cu | AlSiC-based | Al—Ni | 0.38 | 0.38 |
| 8 | $Si_3N_4$ | Cu | Al | Al—Ag | 0.44 | 0.44 |
| 9 | $Al_2O_3$ | Cu | Cu | Al—Cu | 0.65 | 0.65 |
| Comp. Ex. | | | | | | |
| 3 | AlN | Cu | Cu without plating | Soft Solder | 0.39 | 0.69 |
| 4 | AlN | Cu | AlSiC-based without plating | Soft Solder | 0.40 | 0.79 |

As is apparent from Table 2, it was found from the results of Examples 2 and 3 that there was no essential change depending on whether the Al-melting-point lowering layers on both sides of the aluminum foil were formed by coating or vaporization.

Also, it was found from the results of Examples 2 and 4 that by forming Ni platings on respective surfaces of the multilayer structure and the heat sink to be bonded to the aluminum foil, the bonding can be achieved at an even lower temperature.

Further, in Examples 2 to 9, the thermal resistance after 1000 temperature cycles was not changed from the thermal resistance just before temperature cycles. On the other hand, the thermal resistance after 1000 temperature cycles was increased about 77% in Comparative Example 3 and about 98% in comparative Example 4.

Additionally, it was confirmed that no ceramic cracks occurred even after 1000 temperature cycles in any of Examples 2 to 9, whereas ceramic cracks occurred after the 100 temperature cycles in both Comparative Examples 3 and 4.

According to the present invention, as described hereinabove, the first and second aluminum plates are laminated and bonded onto both sides of the ceramic substrate through the Al—Si-based brazing solders, respectively, and the heat sink formed of an AlSiC-based composite material is laminated and bonded onto the surface of the first or second aluminum plate. Thus, when the circuit board is subjected to heat cycles, the first and second aluminum plates having a smaller resistance against deformation than copper plates conventionally used deform elastically and absorb a distortion caused by a difference in thermal expansion coefficient between the ceramic substrate and the aluminum plates. As a result, no cracks occur in the ceramic substrate. In addition, since the AlSiC-based composite material having high thermal conductivity is used for the heat sink, a characteristic of heat dissipation is improved.

When the Al alloy in the heat sink has an Al purity of 80–95% or 80–99% by weight, the first or second aluminum plate has an Al purity not less than 99.98% by weight, and the heat sink is laminated and bonded onto the first or second aluminum plate through the Al alloy in the heat sink, the heat sink can be laminated and bonded onto the first or second aluminum plate without using any brazing solder or soft solder; hence the number of manufacture steps can be reduced.

When the Al alloy in the heat sink has an Al purity of 80–95% or 80–99% by weight, the first or second aluminum plate has an Al purity not less than 99.98% by weight, and the heat sink is laminated and bonded onto the first or second aluminum plate through the Al—Si-based brazing solder having a lower melting point than the heat sink and the first or second aluminum plate, the heat sink can be relatively easily laminated and bonded onto the first or second aluminum plate even when the Al alloy in the heat sink has a relatively low Al purity. Because the Al purity of the Al alloy in the heat sink is relatively low, the heat sink has a larger resistance against deformation than results with a higher Al purity. But, the deformation resistance of the heat sink is yet smaller than that of the conventional heat sink formed of a copper plate. Accordingly, cracks hardly occur in the ceramic substrate although the circuit board is subjected to heat cycles. In addition, since the heat sink can be laminated and bonded onto the first or second aluminum plate at the same time as when the first or second aluminum plate are laminated and bonded onto the ceramic substrate, the number of manufacture steps can be reduced.

When the first or second aluminum plate has an Al purity not less than 99.98% by weight and the heat sink is laminated and bonded onto the first or second aluminum plate through a soft solder, the heat sink can be easily laminated and bonded onto the first or second aluminum plate at a relatively low temperature.

When the multilayer structure and the heat sink are bonded to each other through the aluminum foil having a purity not less than 99% by weight and including the Al-melting-point lowering layers formed on both sides of the aluminum foil, a characteristic of heat dissipation can be improved. Further, since the aluminum foil has a small resistance against deformation, no cracks occurs in the ceramic substrate although the circuit board is subjected to heat cycles. It is thus possible to prolong a life of the circuit board.

When the Ni platings are formed on the respective surfaces of the structure and the heat sink to be bonded to the aluminum foil, the heat sink can be easily bonded to the aluminum plate or the copper plate at a relatively low temperature. Also, when the ceramic substrate is formed of AlN, $Si_3N_4$ or $Al_2O_3$ and the heat sink is formed of Cu, Al or an AlSiC-based composite material, the ceramic substrate can be improved in thermal conductivity, heat resistance, strength depending on the material used, and the heat generated from semiconductor chips, etc. can be effectively dissipated through the heat sink.

Obviously, numerous additional modifications and variations of the present invention are possible in light of the above teachings. It is therefore to be understood that within the scope of the appended claims, the present invention may be practiced otherwise than as specifically described herein.

What is claimed as new and desired to be secured by Letters Patent of the United States is:

1. A ceramic circuit board with a heat sink, comprising:
   a ceramic substrate,
   first and second aluminum plates laminated and bonded onto opposite sides of said ceramic substrate through Al—Si-based brazing solders, respectively, and
   a heat sink formed of an AlSiC-based composite material and laminated and bonded onto a surface of said first or second aluminum plate.

2. The ceramic circuit board with a heat sink according to claim 1, wherein said ceramic substrate is formed of a material selected from the group consisting of AlN, $Si_3N_4$ and $Al_2O_3$.

3. The ceramic circuit board with a heat sink according to either one of claims 1 or 2, wherein the AlSi C-based composite material of said heat sink has an Al purity of 80–99% by weight and said first or second aluminum plate onto which said heat sink is laminated and bonded has an Al purity not less than 99.98% by weight, and
   wherein said heat sink is laminated and bonded onto said first or second aluminum plate through the AlSiC based composite material in said heat sink.

4. The ceramic circuit board with a heat sink according to either one of claims 1 or 2, wherein the AlSi C-based composite material of said heat sink has an Al purity of 80–99% by weight and said first or second aluminum plate onto which said heat sink is laminated and bonded has an Al purity not less than 99.98% by weight, and
   wherein said heat sink is laminated and bonded onto said first or second aluminum plate through an Al—Si-based brazing solder having a lower melting point than said heat sink and said first or second aluminum plate.

5. The ceramic circuit board with a heat sink according to either one of claims 1 or 2, wherein said first or second aluminum plate onto which said heat sink is laminated and bonded has an Al purity not less than 99.98% by weight, and
   wherein said heat sink is laminated and bonded onto said first or second aluminum plate through a soft solder.

6. A ceramic circuit board with a heat sink which includes a multilayer structure formed by laminating and bonding first and second plates made of one of aluminum and copper onto opposite sides of a ceramic substrate, said structure being bonded to a heat sink through said first plate, wherein:
   said multilayer structure and said heat sink are bonded to each other through an aluminum foil having a purity not less than 99% by weight and including Al-melting-point lowering layers formed on both sides of said aluminum foil.

7. The ceramic circuit board with a heat sink according to claim 6, wherein said Al-melting-point lowering layers are selected from the group consisting of Al—Si alloy layers, Al—Cu alloy layers, Al—Mg alloy layers, Al—Ni alloy layers, Al—Ag alloy layers and Al—Ce alloy layers.

8. The ceramic circuit board with a heat sink according to claim 6, wherein Ni platings are formed on respective opposite surfaces of said aluminum foil.

9. The ceramic circuit board with a heat sink according to any one of claims 6 to 7, wherein said ceramic substrate is formed of a material selected form the group consisting of AlN, $Si_3N_4$ and $Al_2O_3$, and said heat sink is formed of a material selected from the group consisting of Cu, Al and an AlSiC-based composite material.

10. The ceramic circuit board with a heat sink according to any one of claims 6 to 7, wherein said aluminum foil has a thickness of 5–500 μm.

* * * * *